United States Patent [19]

Roy

[11] Patent Number: 4,771,910
[45] Date of Patent: Sep. 20, 1988

[54] TOP AND HOUSING WITH PERIPHERAL, RESILIENT INTERFACE

[75] Inventor: Dhirendra C. Roy, Canton, Mich.

[73] Assignee: United Technologies Automotive, Inc., Dearborn, Mich.

[21] Appl. No.: 107,818

[22] Filed: Oct. 13, 1987

[51] Int. Cl.$^4$ .................... B65D 41/16; B65D 41/18
[52] U.S. Cl. .................................... 220/306; 439/347
[58] Field of Search ................ 220/3.7, 3.2, 4 B, 306; 174/67; 339/91 R, 75 R, 75 M; 361/426

[56] References Cited

U.S. PATENT DOCUMENTS

| | | | |
|---|---|---|---|
| 3,544,951 | 12/1970 | Roberts | 339/91 |
| 4,225,206 | 9/1980 | Roman, Jr. | 339/91 R |
| 4,272,145 | 6/1981 | LaDuke | 339/91 R |
| 4,541,036 | 9/1985 | Landries et al. | 220/306 |
| 4,541,538 | 9/1985 | Swetnam | 220/306 |
| 4,635,809 | 1/1987 | Bachman et al. | 220/306 |
| 4,697,720 | 10/1987 | Hotchkiss et al. | 220/306 |

*Primary Examiner*—George T. Hall

[57] ABSTRACT

A rattle-free peripheral interface between a housing and a top latched thereto including at least generally vertically extending, integral, resilient members which are resiliently deformed when the top is latched to the cover, with the integral resilient members providing the sole contact between the opposed peripheries of the top and of the housing. A first form of resilient member includes a pair of oppositely extending, diagonal legs extending down from the top and terminating in feet which resiliently contact rigid shelves or facing areas on the opposed housing (FIG. 4), the housing having a castellated, interdigitated interface with the resilient member. A second form of resilient member includes a vertically extended, thin member on the underside of the top, which is resiliently deformed and in contact with an opposed rigid shelf when the top is latched onto the housing (FIGS. 5A and 5B). A pair of opposed, pivoting latching arms are integrally provided at opposite ends of the top, with each having a fixed restraint limiting the outward movement of the top of the arm, preventing overstressing of the latching system including the integral junction between the arm and the top. With the contact between the top and housing being limited to the resilient members, the balance of their opposed peripheries being generally out of contact, the top has a relatively rattle-free interface with the housing avoiding the need for, for example, a foam gasket.

18 Claims, 4 Drawing Sheets

TOP AND HOUSING WITH PERIPHERAL, RESILIENT INTERFACE

DESCRIPTION

1. Technical Field

The present invention relates to a relatively rattle-free interface between a housing or box and a cover or top therefor, particularly one in which the cover is latched to the housing while the latching means and resilient members will remain preloaded. More particularly, the present invention relates to the providing of integral, peripheral resilient members having different physical configurations, and being integral parts of one of the elements (typically the cover), which members are resiliently preloaded and thus deformed when in engagement with opposed peripheral faces on the other element (typically the housing), with most of the peripheral interfacing between the two elements being out of contact or gapped, providing a relatively rattle-free interface between the two.

2. Background Art

Covers for electromechanical devices used by the automotive industries are, in general, well designed and manufactured. Sometimes, however, it has been observed that certain locking mechanisms of the covers show poor performance standards and even fail after a few operations.

Another observation made is that usually a foam gasket is sandwiched between the cover and the housing for the electromechanical device. The apparent reason for the gasket is to make the cover dynamically stable, that is, rattle-free. The gasket causes additional expense and might lose its initial properties after a period of time, especially while being exposed in an automotive under-hood environment, resulting in the cover and housing thereafter making the system assembly dynamically instable.

The present invention is designed to overcome these problems, and, in particular, to provide a superior interface between the cover and the housing which produces a rattle-free interface without the need of a separate foam gasket, which interface has long term reliability. An additional objective of the present invention is to find a solution that appears sound from both technical and economic viewpoints.

SUMMARY OF THE INVENTION

The present invention provides a superior interface between a housing and the top therefor which includes resilient members located on, for example, the underside of the periphery of the top, which resilient members are integrally formed with the top and engage facing areas on the periphery of the housing. An improved and dependable latching system is included for locking the top to the housing, which, when engaged, provides forces for deforming the resilient members, causing them to be preloaded while being in contact with the housing's facing areas, the peripheries between the top and the housing otherwise being generally gapped or out of contact.

The cover thus "rides on" the housing only at the peripheral resilient members, which represent, for example, only about twenty (20%) percent of the total periphery, while the total actual contact, engagement area is substantially less, for example, only about three (3%) percent. This improved interface provides a rattle-free interconnection, which is long-lasting and relatively inexpensive and reliable.

This superior interface can be achieved by, for example, utilizing resilient members formed by diagonally extending, resilient legs having in their respective preferred embodiments contact feet at distals, or terminal ends. An opposed pair of such resilient legs can be provided on one side, with an essentially like pair located on the opposite side of the top, for interfacing with, for example, castellated interfacing areas in the upper ends of the peripheral walls of the housing.

For a further example, the resilient member can be provided in the form of a both ends clamped, flat beam having a contact foot at the middle and capable of vertically deflecting, interfacing with a similarly configured, opposed shelf at the upper side of the housing, which shelf can either be in line coincident with the wall of the housing, or extended inwardly and/or outwardly from the side of the housing (inwardly, extended shelves being illustrated herein).

With respect to the exemplary forms of the resilient members disclosed herein, the first can be considered analogous to a beam with one end clamped, while the other is analogous to a cantilever beam clamped at both ends. When locked, the clamped beams are stressed in bending, causing the top to be mechanically preloaded.

The total number of resilient members, their configurations and their respective locations will depend on the overall package size and specific design parameters.

In either instance, the resilient members are resiliently deformed by the compressive forces generated by the latches located, for example, at two opposed ends of the housing and its top or cover, and remain mechanically loaded as long as the cover is latched to the housing. The various elements are designed to insure that the resilient members are not overstressed by the latching system, which would otherwise allow for the balance of the housing and cover peripheries to come into intermittent contact, producing a rattle, or which could perhaps cause destruction or failure of one or more of the resilient members.

Typically, the housing and its top (as well as the latching system) are made of molded plastic, and the peripheral resilient members can be produced with little or no added expense in the production of the housing and its top.

These and other objects and advantages of the present invention will become apparent from the following detailed description taken in connection with the accompanying drawings.

BRIEF DESCRIPTION OF THE DRAWINGS

FIG. 2 is a side, partial, cross-sectional view showing the details of the structure of one of the latching arms and its structural connections to the top or cover of FIG. 1; while FIG. 2A is an end, partial, cross-sectional view taken along across section lines 2A—2A of FIG. 2, showing the inner side of the latching arm.

FIG. 4 is a close-up, partial, side view showing in detail the interface between a first form of the resilient member in its preloaded, resilient engagement with the interfacing area (castellated sections) at the top of the housing; while

DESCRIPTION OF THE PREFERRED, EXEMPLARY EMBODIMENT

Figure 1:
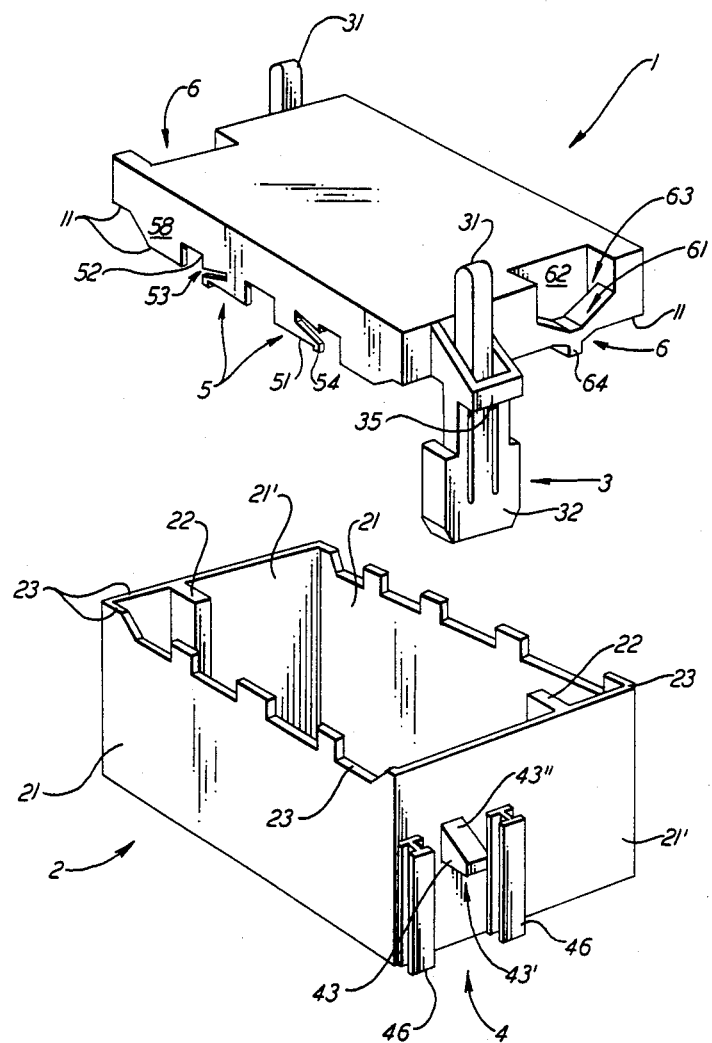
FIG. 1 is a top, exploded, perspective view showing a cover and housing incorporating the preferred, exemplary embodiments of the integral, peripheral, resilient interfaces of the present invention.
Figure 3:
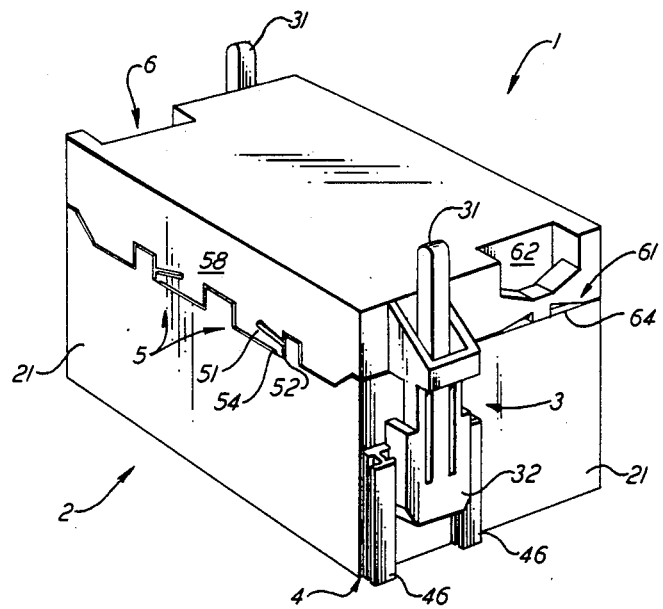
FIG. 3 is a top, perspective view, similar to FIG. 1, but with the cover assembled on the housing, with the end latches engaged.

As can be seen in FIGS. 1 and 3, the preferred, exemplary embodiment of the present invention includes a cover or top 1 and a housing or box 2 with two opposed, but laterally spaced connecting latches 3 and 4 located at opposed ends thereof. Extending downwardly from the underside, peripheral edges of the cover 1 are integral resilient members 5 and 6, a set of each being located on opposed sides 21 or ends 21', respectively, of the housing 2. Lateral spacing for the two sets of latches 3 and 4 is preferred but is not essential.

Figure 2:
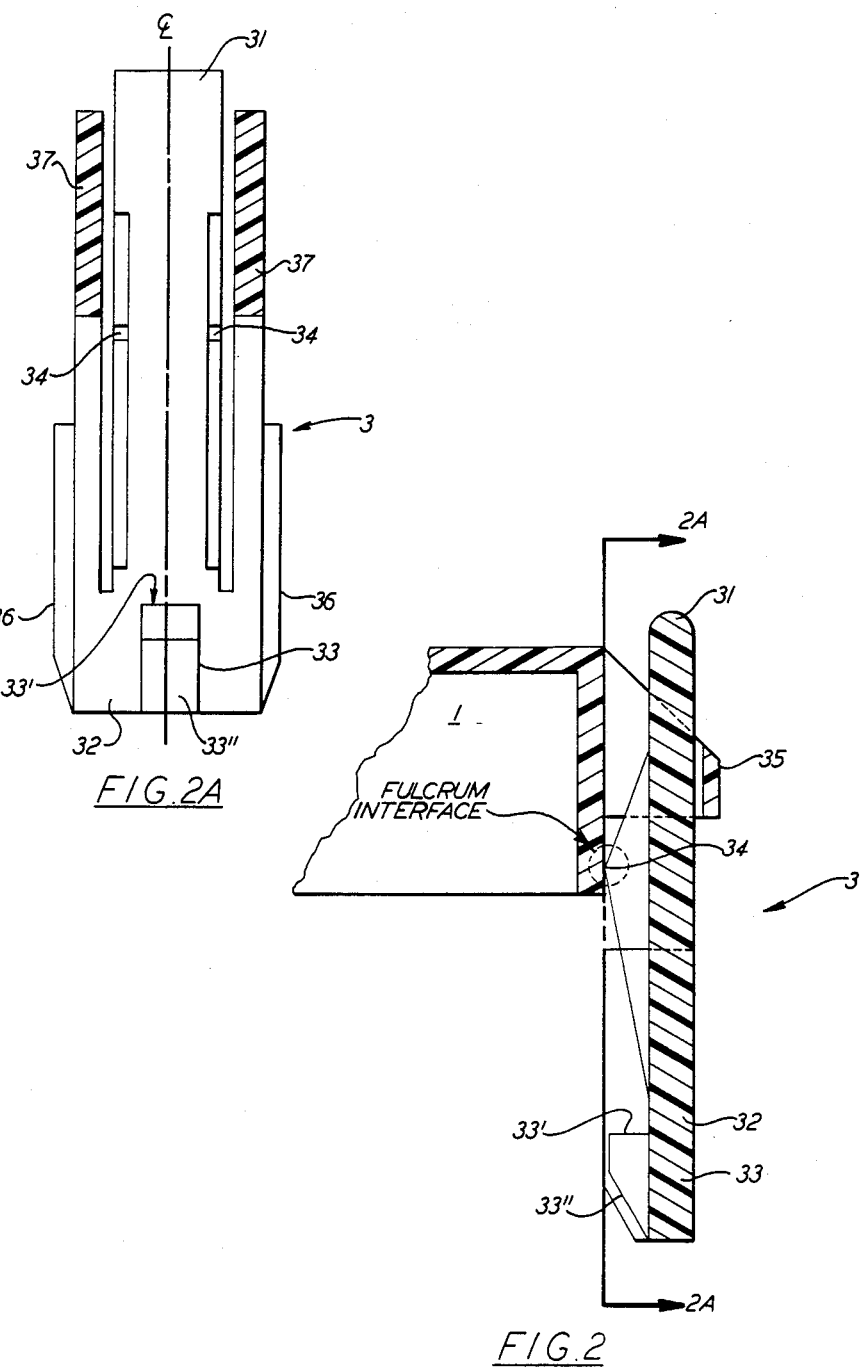

With additional reference to FIGS. 2 and 2A, each latch arm 3 includes a distal, upper end 31, which moves inward during the latching and unlatching operations. The lower end 32 of the latching arm 3 includes on its interior side a tab extension 33 having a horizontally extended, locking tab surface 33', which is engaged against the horizontal undersurface 43' of the housing locking tab 43. The arm locking tab 33 also includes a sloping surface 33" which, when it bears and is moved down against a like sloping surface 43" on the housing 2, causes the lower end of the latching arm 3 to be rotated about the integral connection or clamped junction 37 and thus moved away from its integral connections or clamped junction 37 at the top or cover 1. Ultimately, the arm locking tab 33 snaps over the housing locking tab 43, putting the locking surfaces 33', 43' face to face, latching the cover 1 to the housing or box 2.

When the arm 3 moves, either under the pushing in of the upper, distal end 31 by the user, or by the interaction of the sloping surfaces 33", 43" when the cover 1 is pushed down on to the housing 2, the arm 3 pivots about fulcrum interfaces 34. An outer restraint 35 limits the outward angular travel of the distal end 31 of the arm 3, which prevents the integral clamped junctions 37 as well as the arm 3 from being overstressed.

Vertically extending, opposed guiding rails 46 (see FIG. 1) mate with the sides 36 of the arm 3, guiding the arm 3 into its latching engagement with the housing locking tab 43.

As mentioned and as will be more fully understood below, when the cover 1 is latched onto the housing 2, the resilient members 5 and 6 are resiliently deformed putting the latches under tension that can be expressed as latching forces (L.F.) and providing a resilient, somewhat stiffly, springy interface between the cover 1 and the housing 2. Other than interfacing the interfacing contacts provided by the resilient members 5 and 6, the opposed peripheries 11 and 23 of the cover 1 and the housing 2 are otherwise gapped and out of contact. When the top 1 is unlatched from the housing 2, the resilient members 5, 6 return to their original, undeformed dispositions.

Figure 4:
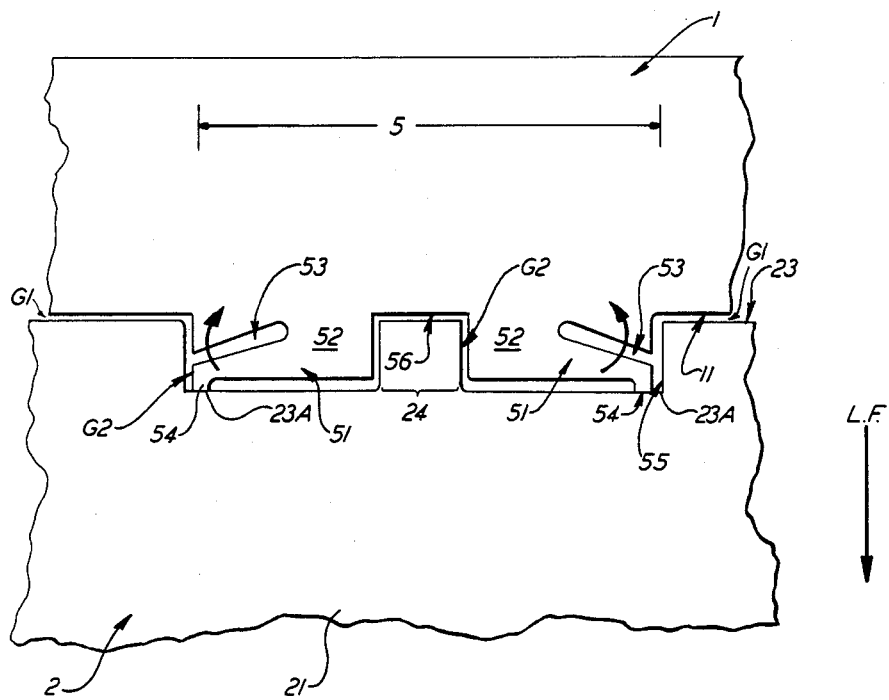

As best seen in FIG. 4, the first form 5 of the resilient member includes at least one, diagonally, extending leg 51 with an upper, connecting portion 52, the two being spaced by a slot 53 having a full radius at the junction 51/52. The slot 53 allows the downwardly extending leg 51 to be resiliently moved up towards the connecting portion 52 (note curved directional arrows), to balance the latching forces "L.F." generated by the latches 3 and 4 while engaged. The leg 51 includes at its terminal, a distal end—a free foot 54, which engages the rigid upper side of the interfacing periphery of the vertical side wall 21 of the housing 2.

Each resilient member 5 preferably includes two such opposed resilient legs 51, which as illustrated in FIG. 4 can be essentially identical in design but preferably are disposed in opposite, outward directions. The downwardly extending resilient leg extensions of the resilient member 5, including the intermediate indented area 56, mate and interdigitate with castellated portions 24 in the side wall 21 of the housing 2.

However, ideally, with respect to even the resilient member 5, there is only very limited contact between the interfacing peripheral structures of the housing 2 and the cover 1, with such contact only occurring at the bottom sides of the feet 54 with the housing areas 23A. As can be seen in FIG. 4, there are otherwise small gaps $G_1$, $G_2$ between the top 1 and the housing 2, not only at the flanking areas 11 and 23, but also within some of the areas defined by the resilient member 5. Thus, for example, when the resilient members 5 totally occupy about twenty (20%) percent of the horizontal periphery of the cover 1, the actual contact or engagement areas between the cover and the housing 2 may represent only about three (3%) percent of the total opposed peripheries.

Figure 5A:
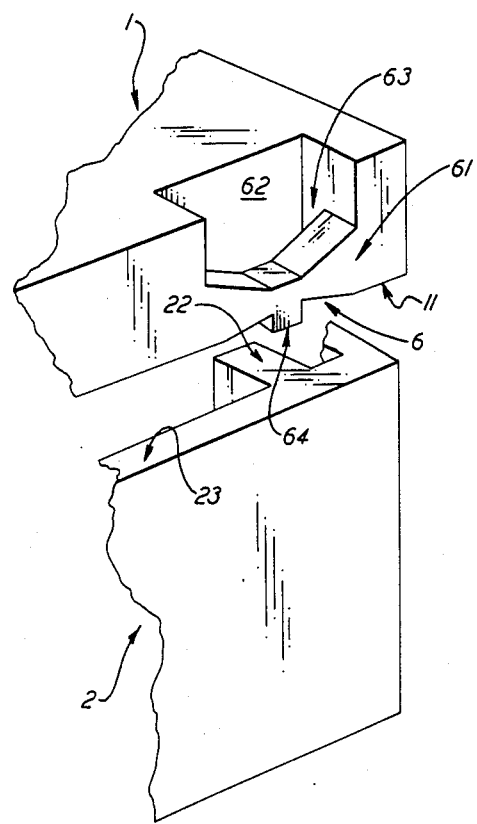
FIGS. 5A and 5B are close-up, partial, side views showing in detail the interface between a second form of the resilient member in its preloaded, resilient engagement with the interfacing area (inwardly directed shelf) at the top of the housing, with FIG. 5A showing the top and housing out of contact and FIG. 5B showing them latched together.
Figure 5B:
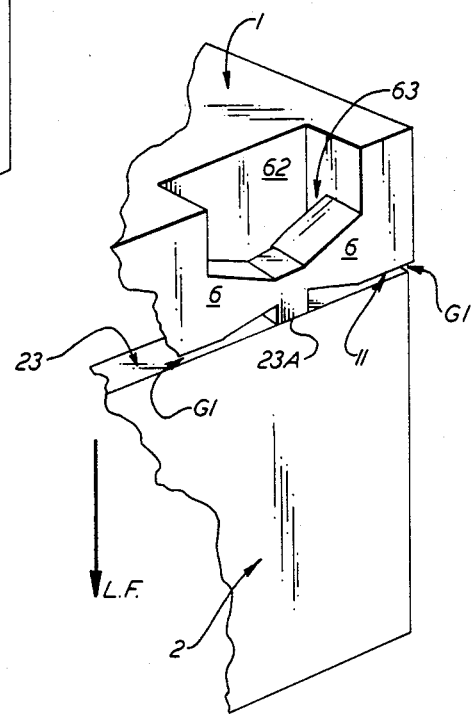

With reference to FIGS. 5A and 5B, a second form 6 of the resilient member includes a both ends clamped, flat beam 61 having a distal tip 64 in contact with a similarly configured, opposed, rigid shelf 22 on the housing 2. The wall 62 and the feature 61 are separated by a narrow gap 63. When the latches 3 and 4 are engaged, the resilient member 61 is deformed, causing the distal tip 62 to be flexed to one side or the other, for example, to the left, as illustrated in FIG. 5. Other than the facial interface of the deformed tip 64 and the shelf 22, the flanking opposed peripheral areas 11 and 23 between the cover 1 and the housing 2 are otherwise spaced and out of contact, having gaps $G_1$ between them. The resilient member 6 differs from the resilient member 5 by being clamped at both ends and having a distal tip 64 at the middle and no distal ends like the free feet 54 as member 5 possesses. The member 5 is aligned with the side wall 58 of the cover; on the other hand, resilient member 6 is not aligned with and is separated from the wall 62 by a narrow gap 63 as shown in FIGS. 5A and 5B.

It is noted that the opposed contact areas or shelves 22 on the upper ends of the walls 21, 21' of the housing 2 can either be longitudinally in line and coincident with its respective wall (as illustrated for the castellated portions 24) or can be directed inwardly, orthogonal to its respective wall (as illustrated for the shelves 22). Additionally the shelves 22 can either extend into the interior of the housing 2, as illustrated, or extend outwardly on the exterior.

It is further noted that the effective lengths of the arms 3, the relative locations of the housing locking tabs 43, and the vertical extension lengths of the resilient legs 51, 61, down from the flanking areas 11, are all interrelated to prevent over stressing of the resilient members 5, 6. This prevents engagement or contact between the opposed peripheries 11 and 23 of the top 1 and the housing 2 along all of their respective lengths, except for the limited contact provided by the feet 54, 64 and the contact areas 23A, 22, respectively. Thus, when the cover 1 and the housing 2 are installed and latched together, the springy or resilient members 5, 6 provide enough preload, so that a rattle-free system can be virtually guaranteed.

As illustrated, the resilient members 5, 6 can be integrally formed as part of the cover 1, with the cover and its latch arms 3 being made in a single molded structure. It is to be further noted that the relative resilient member/contact area interfacing is reversible, that is, the resilient members 5, 6 can alternatively be formed as upward extensions for the walls 21, 21' of the housing 2, with the contact areas (castellated portions and shelves) being provided on the peripheral underside of the top 1, although the former is preferred. Additionally, if desired, other interfacings between the top 1 and the housing 2 can be included, particularly in their interior areas, but care should be taken to design them so that it is still a rattle-free system.

Exemplary dimensions for the resilient members 5 and its related elements are outlined below:

| | |
|---|---|
| Horizontal length of the top (side 21 of the housing) | 100 mm |
| Horizontal width of the top (side 21' of the housing) | 75 mm |
| Horizontal distance between two opposed feet of resilient member 5 on one side 21 | 37.0 mm |
| Contact area of a single foot 54 | 2.0 × 2.0 mm$^2$ |
| Vertical height of single foot 54 from its bottom tip to leg end | 1.0 mm |
| Thickness of diagonal leg of the resilient member 5 | 2.0 mm |
| Width of slot 53 | 1.5 mm |
| Vertical height of leg portions 5 (clamped junction/free end) | 3.5/1.5 mm |
| Gap $G_1$ | 0.7 mm |

An exemplary application for the cover 1 and housing 2 of the invention in the automotive industry is as an enclosed fuse box for a car. An exemplary material for the molded top 1 is a plastic of moderately high flexural strength.

The total number of springs or resilient members 5, 6, their configurations, and their respective locations are determined based on the overall package size and specific design parameters.

Although this invention has been shown and described with respect to detailed, exemplary embodiments thereof, it will be understood by those skilled in the art that various changes in form and detail thereof may be made without departing from the spirit and scope of the claimed invention. In this regard it is noted that the terms "vertical" and "horizontal" are used herein in their general, relative senses, and not in their absolute sense with respect to the earth's surface.

having thus described at least one exemplary embodiment of the invention, that which is claimed as new and desired to be secured by Letters Patent is:

1. An interface between a housing and a top mounted thereon, comprising:
   a housing element;
   a top element located on and opposed to said housing element;
   a facing area on one of said elements;
   an at least generally vertically extending resilient member opposed to said facing area on the other of said elements in physically deformed, resilient contact therewith;
   first and second, at least generally horizontally extending, peripheral surfaces on said one of said elements flanking said facing area;
   third and fourth, at least generally horizontally extending, peripheral surfaces on said other of said elements flanking said resilient member and opposed to, but spaced from, said first and second peripheral surfaces by a small gap, the combined peripheral lengths of each said first and second peripheral surfaces and said third and fourth peripheral surfaces being substantially greater than the width of said facing area and said resilient member, respectively; and
   latching means connected between said housing element and said top element for latching the top to the housing with a force great enough to said resilient members forcing the top down against the resistive forces resulted from the deformations of the resilient members, but less than the force required to cause said first and second peripheral surfaces to come into contact with said third and fourth peripheral surfaces, providing a relatively rattle-free interface between the top and the housing to which it is latched.

2. The top/housing interface of claim 1, wherein said housing element and said top element have at least two opposed walls, and wherein there is further included an opposed set of said resilient members, one on each of said opposed walls.

3. The top/housing interface of claim 1, wherein said resilient member includes at least one vertically extending leg, which can be flexed in a vertical direction, providing at least in part the resiliency of said resilient member.

4. The top/housing interface of claim 3, wherein said leg further extends laterally, as well as vertically, resulting in a diagonally disposed leg.

5. The top/housing interface of claim 4, wherein said leg has a distal, terminal end and wherein there is further provided a foot extension on said distal, terminal end of said leg, contact between said leg, and the opposed facing area being restricted to the bottom of said foot extension.

6. The top/housing interface of claim 4, wherein said resilient member includes an opposed pair of said diagonal legs, one leg extending in the opposite, lateral direction to the other leg.

7. The top/housing interface of claim 6, wherein there is further included:
   an indented area between said pair of diagonal legs; and
   a castellated portion on its opposed element, said pair of diagonal legs and said indented area being interdigitated with said castellated portion.

8. The top/housing interface of claim 1, wherein said resilient member has at least generally a thin, elongated, rectangular configuration in its cross section in the horizontal plane, the distal, terminal end of which is caused to be flexed to one side, providing the resilient deformity in said resilient member.

9. The top/housing interface of claim 1, wherein the housing element and the top element have at least two, opposed walls; and wherein there is provided an opposed pair of said latching means, one on each of said opposed walls.

10. The top/housing interface of claim 9, wherein said opposed pair of latching means is laterally spaced with respect to one another.

11. The top/housing interface of claim 1, wherein said latching means includes a pivoting arm having a distal end and is integrally formed with its respective element by means of a clamped junction, and wherein there is further provided restraint means fixedly mounted adjacent to said distal end of said latching means for limiting the outward movement of said distal end, preventing any overstressing.

12. The top/housing interface of claim 1, wherein said resilient member is integrally part of its respective element.

13. The top/housing interface of claim 12, wherein said respective element is said top element.

14. The top/housing interface of claim 13, wherein said housing element and said top element have at least two opposed walls, and wherein there is further included a set of said resilient members, one on each of said opposed walls, each of said resilient members being an integral part of and extending downardly from said top element, each of said resilient members including a pair of resilient, spaced, oppositely directed diagonal legs.

15. The top/housing interface of claim 14, wherein a foot extension is provided on the distal, terminal end of each of said legs, contact between said legs and the opposed facing areas being restricted to the bottoms of said foot extensions.

16. An interface between a housing and a top mounted thereon, comprising:
a housing element;
a top element located on and opposed to said housing element;
a facing area on said housing elements;
an at least generally vertically and downwardly extending resilient member opposed to said facing area on and integrally formed with said top element in physically deformed, resilient contact with said facing area; said housing element and said top element having at least two opposed walls, there being included a set of said resilient members and a corresponding set of facing areas, one of each on each of said opposed walls, each of said resilient members being integrally part of and extending downwardly from said top element, each of said resilient members including:
a pair of resilient, spaced, oppositely directed diagonal legs;
a foot extension provided on the distal, terminal end of each of said legs, contact between said legs and the opposed facing areas being restricted to the bottoms of said foot extensions; and
an indented area between said pair of diagonal legs;
a castellated portion being provided on said housing element, said pair of diagonal legs and said indented area being interdigitated with said castellated portion;

first and second, at least generally horizontally extending, peripheral surfaces on said housing element flanking said facing areas;
third and fourth, at least generally horizontally extending, peripheral surfaces on said top element flanking said resilient members and opposed to, but spaced from, said first and second peripheral surfaces by a small gap, the combined peripheral lengths of each said first and second peripheral surfaces and said third and fourth peripheral surfaces being substantially greater than the spaces occupied by said facing area and said resilient members, respectively; and
latching means connected between said housing element and said top element for latching the top to the housing with a compressive force great enough to deform said resilient members forcing the top down against the resistive, but resilient, forces produced by said deformed resilient members, but less than the force required to cause said first and second peripheral surfaces to come into contact with said third and fourth peripheral surfaces, providing a relatively rattle-free top and housing assembly.

17. The top/housing interface of claim 16, wherein there is provided an opposed pair of said latching means located on opposite sides of said housing and said top elements.

18. The top/housing interface of claim 17, wherein said opposed pair of latching means is laterally spaced with respect to one another.

* * * * *